United States Patent
Lei et al.

(10) Patent No.: US 9,735,064 B2
(45) Date of Patent: Aug. 15, 2017

(54) CHARGE DYNAMICS EFFECT FOR DETECTION OF VOLTAGE CONTRAST DEFECT AND DETERMINATION OF SHORTING LOCATION

(71) Applicant: GLOBALFOUNDRIES Inc., Grand Cayman (KY)

(72) Inventors: Ming Lei, Ballston Lake, NY (US); Byoung-Gi Min, Cohoes, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 35 days.

(21) Appl. No.: 14/812,317

(22) Filed: Jul. 29, 2015

(65) Prior Publication Data
US 2017/0032929 A1   Feb. 2, 2017

(51) Int. Cl.
*G01R 31/02*   (2006.01)
*H01L 21/66*   (2006.01)

(52) U.S. Cl.
CPC .... *H01L 22/00* (2013.01); *H01J 2237/24564* (2013.01); *H01J 2237/24592* (2013.01); *H01J 2237/2817* (2013.01)

(58) Field of Classification Search
CPC ............ G06F 17/5045; G06F 17/5081; H01L 21/67005; H01L 22/12; G03F 1/84; G01N 2021/8854; G01N 21/9501; G01N 21/95607; G01N 21/8851; G01N 21/956; G01R 31/2894; G05B 2219/45031; G05B 23/0297; G06K 2009/4666; G06K 9/52; G06T 2207/30148; G06T 7/0006; G06T 7/0008; G06T 7/001; G06T 2207/20112; H01J 2237/063

See application file for complete search history.

(56) References Cited

U.S. PATENT DOCUMENTS

| | | | |
|---|---|---|---|
| 7,570,800 B2 * | 8/2009 | Lin ..................... | G06T 7/001 382/149 |
| 8,194,968 B2 * | 6/2012 | Park .................... | G01N 21/8851 382/145 |
| 8,781,781 B2 * | 7/2014 | Kulkarni ............ | G05B 23/0297 702/108 |

* cited by examiner

*Primary Examiner* — Vinh Nguyen
(74) *Attorney, Agent, or Firm* — Ditthavong & Steiner, P.C.

(57) ABSTRACT

A method and apparatus for detecting VC defects and determining the exact shorting locations based on charging dynamics induced by scan direction variation are provided. Embodiments include providing a substrate having at least a partially formed device thereon, the partially formed device having at least a word-line, a share contact, and a bit-line; performing a first EBI on the at least partially formed device in a single direction; classifying defects by ADC based on the first EBI inspection; selecting DOI among the classified defects for further review; performing a second EBI on the DOI in a first, second, third, and fourth direction; comparing a result of the first direction against a result of the second direction and/or a result of the third direction against a result of the fourth direction; and determining a shorting location for each DOI based on the one or more comparisons.

20 Claims, 4 Drawing Sheets

CHARGE DYNAMICS EFFECT FOR DETECTION OF VOLTAGE CONTRAST DEFECT AND DETERMINATION OF SHORTING LOCATION

TECHNICAL FIELD

The present disclosure relates to a manufacture of semiconductor devices such as integrated circuits. The present disclosure is particularly applicable to detecting voltage contrast (VC) defects.

BACKGROUND

Certain embedded defects such as shallow trench isolation (STI) voids, which may result in electric defects such as a contact-gate short have been the most critical yield detractors for advanced technology development due to narrower process windows resulting from aggressive scaling. Detection of critical electric defects by optical-based metrologies, e.g., bright field inspection (BFI), is challenging. For example, detection of such electric defects is beyond the physical limitations of optical-based metrologies in terms of resolution and/or contrast because such metrologies are often unable to produce enough signal response relative to corresponding noise. Consequently, electron beam inspection (EBI) has been the most popular in-line detection of electrical defects as well as physical defects. However, detection of a contact-gate short defect by EBI is still challenging because the scanning electron image of the potential defect is not a steady state of material response under electron beam (ebeam) exposure. In addition, different shorting defects may result in the same patch image when scanned along a certain direction, e.g., a standard scan direction. Thus, identification of the actual shorting location as well as the failure mechanism may be difficult to determine based on a single scan.

A need therefore exists for methodology and apparatus enabling separating real shorting defects from other charging artifacts, e.g., nuisance/false defects, and for identifying the exact shorting locations.

SUMMARY

An aspect of the present disclosure is a method of detecting voltage contrast (VC) defects and determining the exact shorting locations based on charging dynamics induced by scan direction variation.

Another aspect of the present disclosure is an apparatus for detecting VC defects and determining the exact shorting locations based on charging dynamics induced by scan direction variation.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a substrate having at least a partially formed device thereon, the partially formed device having at least a word-line, a share contact, and a bit-line; performing a first EBI on the at least partially formed device in a single direction; classifying defects by automatic defect classification (ADC) based on the first EBI inspection; selecting defects of interest (DOI) among the classified defects for further review; performing a second EBI on the DOI in a first, second, third, and fourth direction; comparing a result of the first direction against a result of the second direction and/or a result of the third direction against a result of the fourth direction; and determining a shorting location for each DOI based on the one or more comparisons.

Aspects of the present disclosure include the classified defects either being open and/or dark voltage contrast (DVC) defects or short, leakage, and/or bright voltage contrast (BVC) defects. Other aspects include the DOI being the short, leakage, and/or BVC defects induced by a STI void. Further aspects include the first and second directions being perpendicular to the third and fourth directions and the first and second directions and the third and fourth directions being opposite each other, respectively. Additional aspects include determining that the shorting location is between a word-line and a share contact based on a contrast between the results of the first and second directions. Another aspect includes the contrast being a bit-line appearing completely bright in the first direction and half-bright/half-dark in the second direction. Other aspects include the half-dark side being the shorting location. Further aspects include determining that the shorting location is between a bit-line and a word-line based on a similarity between the results of the third and fourth directions. Additional aspects include the similarity being a bit-line appearing completely bright in the third direction and fourth directions.

Another aspect of the present disclosure is an apparatus including: a processor; and a memory including computer program code for one or more programs, the memory and the computer program code configured to, with the processor, cause the apparatus to: perform a first EBI on at least a partially formed device in a first direction, the partially formed device having at least a word-line, a share contact, and a bit-line; classify defects by ADC based on the first EBI inspection; select DOI among the classified defects for further review; perform a second EBI on the DOI in a first, second, third, and fourth direction; compare a result of the first direction against a result of the second direction and/or a result of the third direction against a result of the fourth direction; and determine a shorting location for each DOI based on the one or more comparisons.

Aspects of the apparatus include the classified defects either being open and/or DVC defects or short, leakage, and/or BVC defects and the DOI being the short, leakage, and/or BVC defects induced by a STI void. Other aspects include the first and second directions being perpendicular to the third and fourth directions and the first and second directions and the third and fourth directions being opposite each other, respectively. Further aspects include the apparatus being caused to: determine that the shorting location is between a word-line and a share contact based on a contrast between the results of the first and second directions. Additional aspects include the contrast being a bit-line appearing completely bright in the first direction and half-bright/half-dark in the second direction. Another aspect includes the half dark-side being the shorting location. Other aspects include the apparatus being caused to: determine that the shorting location is between a bit-line and a word-line based on a similarity between the results of the third and fourth directions. Further aspects include the similarity being a bit-line appearing completely bright in the third direction and fourth directions.

A further aspect of the present disclosure is a method including: providing a substrate having at least a partially formed device thereon, the partially formed device having at least a word-line, a share contact, and a bit-line; performing a first EBI on the at least partially formed device in a single direction; separating open and/or DVC defects from short, leakage, and/or or BVC defects by on-tool ADC; selecting the short, leakage, and/or BVC defects for further review; performing a second EBI on the short, leakage, and/or BVC defects in a first, second, third, and fourth direction, the first and second directions being perpendicular to the third and fourth directions and the first and second directions and the third and fourth directions being opposite each other, respectively; comparing a result of the first direction against a result of the second direction and/or a result of the third direction against a result of the fourth direction; and determining a shorting location for each of the short, leakage, and/or BVC defects based on the one or more comparisons.

Aspects of the present disclosure include determining that the shorting location is between a word-line and a share contact based on a bit-line appearing completely bright in the first direction and half-bright/half-dark in the second direction, the half-dark side being the shorting location. Other aspects include determining that the shorting location is between a bit-line and a word-line based on a bit line appearing completely bright in the third direction and fourth directions.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of unreliable detection and identification of electric failures attendant upon advanced technology development.

Methodology in accordance with embodiments of the present disclosure includes providing a substrate having at least a partially formed device thereon, the partially formed device having at least a word-line, a share contact, and a bit-line. A first EBI is performed on the at least partially formed device in a single direction. Defects are classified by ADC based on the first EBI inspection. DOI are selected among the classified defects for further review. A second EBI is performed on the DOI in a first, second, third, and fourth direction. A result of the first direction against a result of the second direction and/or a result of the third direction against a result of the fourth direction are compared and a shorting location for each DOI is determined based on the one or more comparisons.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
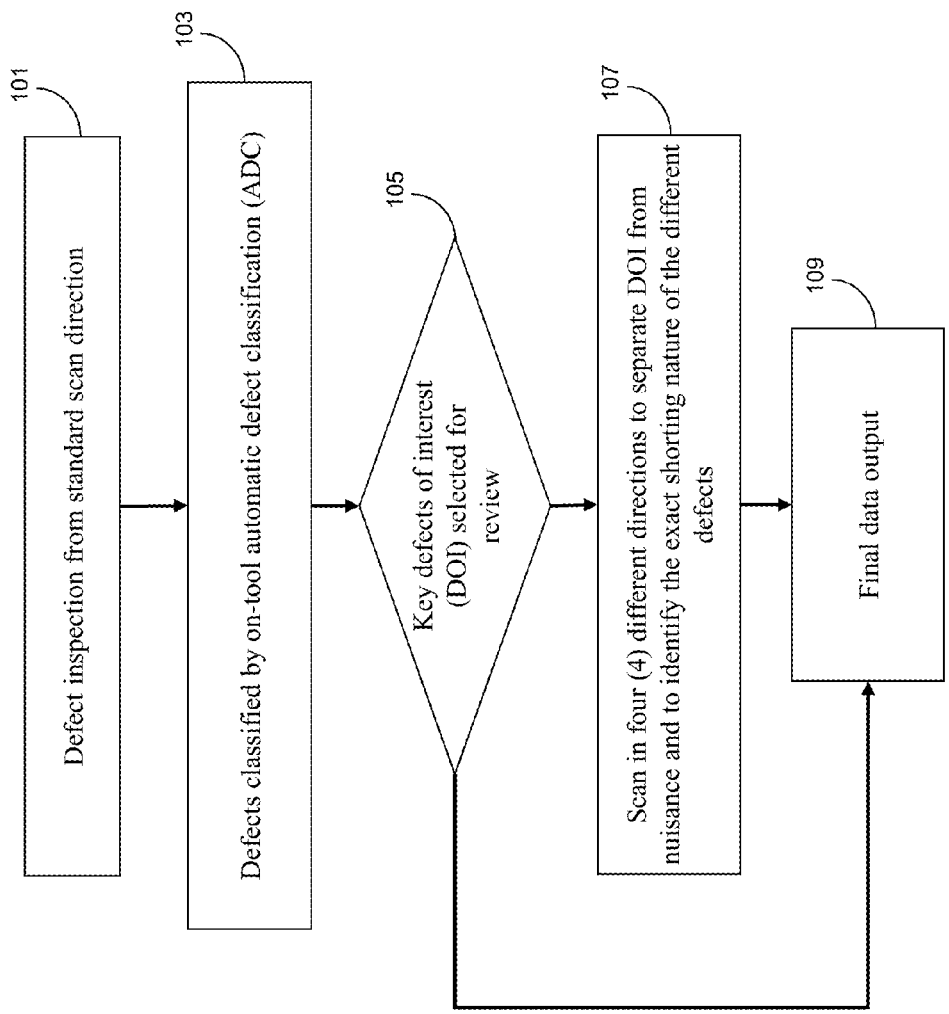
FIG. 1 illustrates a process flow for detecting VC defects and determining the exact shorting locations based on charging dynamics induced by scan direction variation, in accordance with an exemplary embodiment.
Figure 2A:
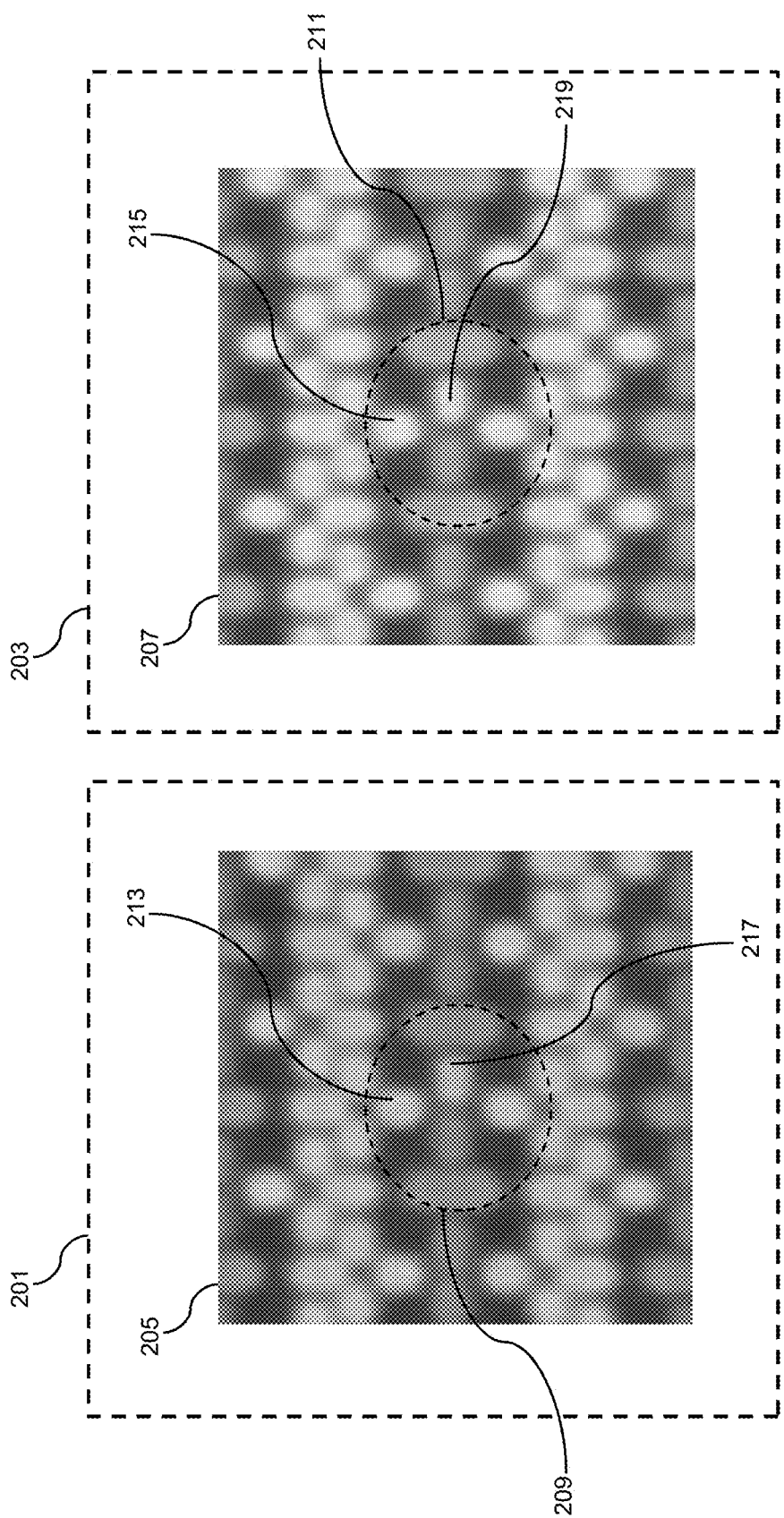
FIGS. 2A through 2C illustrate an example of the VC defect detection and exact shorting location determination based on charging dynamics induced by scan direction variation, in accordance with an exemplary embodiment.
Figure 2B:
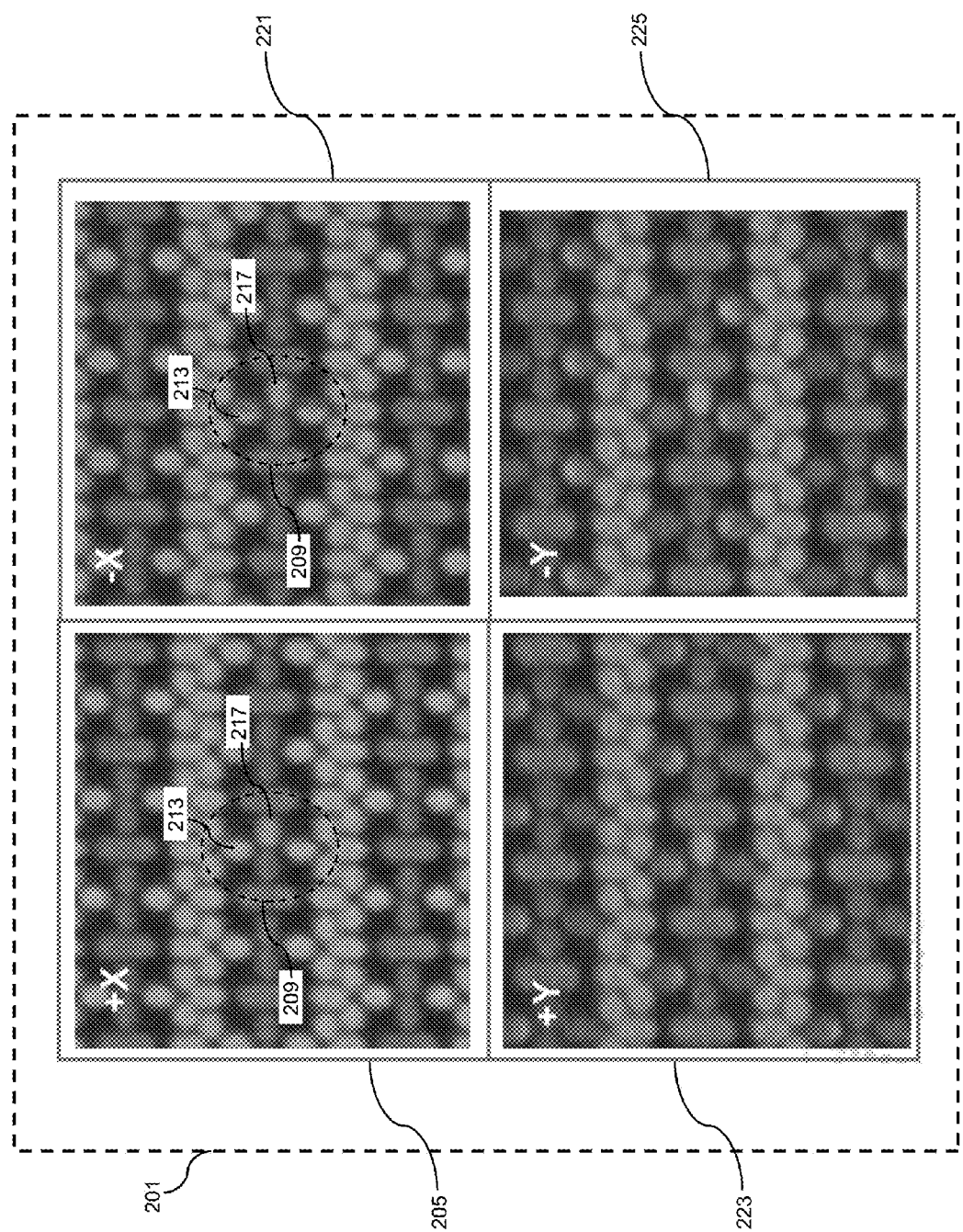
Figure 2C:
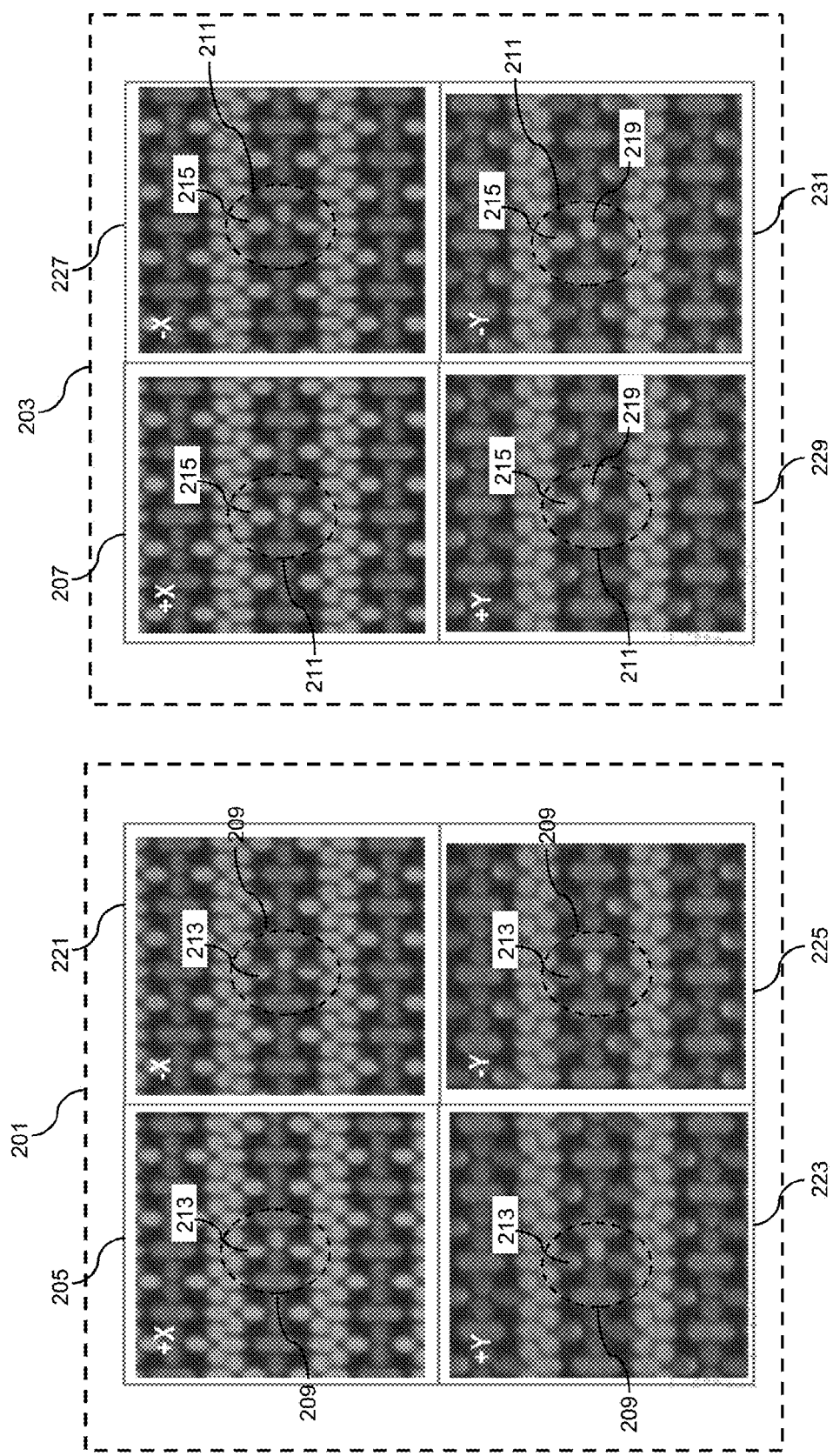

FIG. 1 illustrates a process flow for detecting VC defects and determining the exact shorting locations based on charging dynamics induced by scan direction variation, in accordance with an exemplary embodiment, and FIGS. 2A through 2C illustrate an example of the VC defect detection and exact shorting location determination. In step 101, an EBI is performed in a single or standard direction, e.g., left to right (+X), on neighboring dies 201 and 203 of a substrate (not shown for illustrative convenience). The neighboring dies 201 and 203 each have at least a partially formed device (not shown for illustrative convenience), which has at least a word-line, a share contact, and a bit-line. For example, the partially formed device may be a static random access memory (SRAM). Adverting to FIG. 2A, scanning electron microscope (SEM) patch images 205 and 207 represent the respective results of the EBI (step 101) on the neighboring dies 201 and 203. The dashed circles 209 and 211 highlight identical inconsistent patterns among the vertical bit-lines, e.g., bit-lines 213 and 215, and the horizontal word-lines, e.g., word-line 217 and 219. The identical inconsistent patterns caused by the EBI performed in a single direction suggest the presence of identical defects among the dies 201 and 203. However, as will be seen, charging dynamics induced scan direction variation indicates that the short locations are actually completely different for the dies 201 and 203.

The voltage contrast from the SEM images, e.g., patch images 205 and 207, is a result of the variation of surface potential at different locations, i.e., in general, higher potential will result in a darker image and lower potential will result in a brighter image. A simple R-C circuit model can be used to describe most of the electric responses from logic devices under ebeam exposure because the second electron yield does not vary as fast as the circuit response. The effect of the ebeam can be treated as electron pulses with pulse duration $\Delta t$, which is determined by the scan rate. Accordingly, the analytic solution of the R-C circuit under the ebeam exposure can be solved as $U=I_0R(1-e^{-t/RC})$, wherein each ebeam cycle=$\Delta t$. The charging and dis-charging dynamics of this R-C circuit depends on the intrinsic time constant $\tau=RC$, which is on the order of $\tau\approx$microsecond ($\mu s$), whereas the typical scan rate from most ebeam tools is roughly $\Delta t \approx 10$ nanosecond (ns).

In step 103, any defects determined by the EBI in the single direction, e.g., (+X), are classified by an on-tool ADC. For example, the defects may either be open and/or DVC defects or short, leakage, and/or BVC defects, e.g., a STI void that may result in an electric failure like a contact-gate short. In step 105, key DOI are selected for further review. For the purposes of this disclosure, the key DOI are short, leakage, and/or BVC defects such as the defects highlighted by the circles 209 and 211. Further review of these defect regions is warranted because different defect locations may result in the same patch image, e.g., patch images 205 and 207, based on the EBI in a single scan direction, e.g., (+X). In contrast, if there are no key DOI present, the results of the EBI and/or on-tool ADC in steps 101 and 103, respectively, are outputted for further device processing in step 109.

In step 107, an EBI is performed on the key DOI in four different scan directions to separate DOI from nuisance and to identify the exact shorting nature of the different defects. The first and second directions are perpendicular to the third and fourth directions and the first and second directions and the third and fourth directions are opposite each other, respectively. For example, if the first scan direction is from left to right (+X), then the second scan direction is from right to left (−X). Similarly, if the third scan direction is from top to bottom (+Y), then the fourth scan direction is from bottom to top (−Y). Adverting to FIG. 2B, patch images 205, 221, 223, and 225 represent the results of the EBI performed in the four different directions (+X), (−X), (+Y), and (−Y), respectively. When scanning from right to left (−X), the entire bit-line 213 appears half-bright and half-dark with the dark half on the same side as the shorting location, i.e., the right side. This half-bright/half-dark phenomenon is caused by the potential pull-down due to a contact-gate short, which turns off the passing gate transistor between the bit-line 213 and the word-line 217. The bit-line 213 becomes an isolated N-P junction under reversed bias, thus resulting in a dark image from higher transient contact potential at the bit-line 213. In contrast, when scanning from the normal side to the shorting side, i.e., left to right (+X), the entire bit line 213 is bright even though the passing gate is still turned off when the ebeam reaches the right half of the bit line 213. This contrast between (+X) and (−X) scan directions is explained by the other normal passing gate being able to hold the positive charge for a long enough time compared to the ebeam scan rate $\tau \gg \Delta t$. This kind of charging dynamics, which originates from the transistor behavior, strongly indicates the existence of a contact-gate short between the word-line 217 and the share contact (not shown for illustrative convenience), e.g., on the world-line 217.

Adverting to FIG. 2C, the results of the EBI performed on the key DOI in four different scan directions (step 107) also shows different responses from the top of the bit-lines 213 and 215. For example, the entire bit-line 213 of patch images 223 and 225 (+Y and −Y) is dark and, therefore, not defective, whereas the bit-line 213 either appears completely bright or half-bright/half-dark in patch images 205 and 221 (+X and −X). In contrast, only the top of the bit-line 215 is always bright in patch images 229 and 231 (+Y and −Y), whereas the entire bit-line 215 is completely bright in patch images 207 and 227. The similarity between the completely bright top of the bit-line 215 in patch images 229 and 231 (+Y and −Y) indicates an additional short between the bit-line 215 and the word line 219 on the die 203. As discussed above, once the DOI are separated from nuisance and the exact nature/location of the different defects is identified, the final data is outputted for further device processing in step 109.

The embodiments of the present disclosure can achieve several technical effects including identifying the real electric defects and the actual short location of such defects, the ADC algorithm may be built according to the above methodology to further separate the different defects, and the scan direction variation effect may be used on other voltage contrast defects depending on the circuit design structure and charging dynamics of the specific circuit. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    providing a substrate having at least a partially formed device thereon, the partially formed device having at least a word-line, a share contact, and a bit-line;
    performing a first electron beam inspection (EBI) on the at least partially formed device in a single direction;
    classifying defects by automatic defect classification (ADC) based on the first EBI inspection;
    selecting defects of interest (DOI) among the classified defects for further review;
    performing a second EBI on the DOI in a first, second, third, and fourth direction;
    comparing a result of the first direction against a result of the second direction and/or a result of the third direction against a result of the fourth direction; and
    determining a shorting location for each DOI based on the one or more comparisons.

2. The method according to claim 1, wherein the classified defects comprise either open and/or dark voltage contrast (DVC) defects or short, leakage, and/or bright voltage contrast (BVC) defects.

3. The method according to claim 2, wherein the DOI comprise the short, leakage, and/or BVC defects induced by a shallow trench isolation (STI) void.

4. The method according to claim 1, wherein the first and second directions are perpendicular to the third and fourth directions and the first and second directions and the third and fourth directions are opposite each other, respectively.

5. The method according to claim 1, comprising determining that the shorting location is between a word-line and a share contact based on a contrast between the results of the first and second directions.

6. The method according to claim 5, wherein the contrast comprises a bit-line appearing completely bright in the first direction and half-bright/half-dark in the second direction.

7. The method according to claim 6, wherein the half-dark side comprises the shorting location.

8. The method according to claim 1, comprising determining that the shorting location is between a bit-line and a word-line based on a similarity between the results of the third and fourth directions.

9. The method according to claim 8, wherein the similarity comprises a bit-line appearing completely bright in the third direction and fourth directions.

10. An apparatus comprising:
a processor; and
a memory including computer program code for one or more programs, the memory and the computer program code configured to, with the processor, cause the apparatus to:
perform a first electron beam inspection (EBI) on at least a partially formed device in a first direction, the partially formed device having at least a word-line, a share contact, and a bit-line;
classify defects by automatic defect classification (ADC) based on the first EBI inspection;
select defects of interest (DOI) among the classified defects for further review;
perform a second EBI on the DOI in a first, second, third, and fourth direction;
compare a result of the first direction against a result of the second direction and/or a result of the third direction against a result of the fourth direction; and
determine a shorting location for each DOI based on the one or more comparisons.

11. The apparatus according to claim 10, wherein the classified defects are either open and/or dark voltage contrast (DVC) defects or short, leakage, and/or bright voltage contrast (BVC) defects and the DOI are the short, leakage, and/or BVC defects induced by a shallow trench isolation (STI) void.

12. The apparatus according to claim 10, wherein the first and second directions are perpendicular to the third and fourth directions and the first and second directions and the third and fourth directions are opposite each other, respectively.

13. The apparatus according to claim 10, wherein the apparatus is caused to:
determine that the shorting location is between a word-line and a share contact based on a contrast between the results of the first and second directions.

14. The apparatus according to claim 13, wherein the contrast comprises a bit-line appearing completely bright in the first direction and half-bright/half-dark in the second direction.

15. The apparatus according to claim 14, wherein the half dark-side comprises the shorting location.

16. The apparatus according to claim 10, wherein the apparatus is caused to:
determine that the shorting location is between a bit-line and a word-line based on a similarity between the results of the third and fourth directions.

17. The apparatus according to claim 16, wherein the similarity comprises a bit-line appearing completely bright in the third direction and fourth directions.

18. A method comprising:
providing a substrate having at least a partially formed device thereon, the partially formed device having at least a word-line, a share contact, and a bit-line;
performing a first electron beam inspection (EBI) on the at least partially formed device in a single direction;
separating open and/or dark voltage contrast (DVC) defects from short, leakage, and/or or bright voltage contrast (BVC) defects by on-tool automatic defect classification (ADC);
selecting the short, leakage, and/or BVC defects for further review;
performing a second EBI on the short, leakage, and/or BVC defects in a first, second, third, and fourth direction, the first and second directions being perpendicular to the third and fourth directions and the first and second directions and the third and fourth directions being opposite each other, respectively;
comparing a result of the first direction against a result of the second direction and/or a result of the third direction against a result of the fourth direction; and
determining a shorting location for each of the short, leakage, and/or BVC defects based on the one or more comparisons.

19. The method according to claim 18, comprising determining that the shorting location is between a word-line and a share contact based on a bit-line appearing completely bright in the first direction and half-bright/half-dark in the second direction, the half-dark side being the shorting location.

20. The method according to claim 18, comprising determining that the shorting location is between a bit-line and a word-line based on a bit line appearing completely bright in the third direction and fourth directions.

* * * * *